(12) United States Patent
Dark

(10) Patent No.: US 7,776,708 B1
(45) Date of Patent: Aug. 17, 2010

(54) SYSTEM AND METHOD FOR PROVIDING A NITRIDE CAP OVER A POLYSILICON FILLED TRENCH TO PREVENT FORMATION OF A VERTICAL BIRD'S BEAK STRUCTURE IN THE MANUFACTURE OF A SEMICONDUCTOR DEVICE

(75) Inventor: Charles A. Dark, Arlington, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 616 days.

(21) Appl. No.: 11/201,926

(22) Filed: Aug. 11, 2005

(51) Int. Cl.
*H01L 21/76* (2006.01)
(52) U.S. Cl. ............................. 438/400; 257/499
(58) Field of Classification Search .............. 438/400; 257/499
See application file for complete search history.

(56) References Cited

U.S. PATENT DOCUMENTS

| | | | |
|---|---|---|---|
| 5,110,756 A | 5/1992 | Gregor et al. | |
| 5,116,778 A * | 5/1992 | Haskell et al. | 438/221 |
| 5,116,779 A * | 5/1992 | Iguchi | 438/425 |
| 5,128,274 A | 7/1992 | Yabu et al. | |
| 5,148,257 A * | 9/1992 | Kishi | 257/520 |
| 5,344,785 A * | 9/1994 | Jerome et al. | 438/311 |
| 5,369,052 A | 11/1994 | Kenkare et al. | |
| 5,464,790 A * | 11/1995 | Hawley | 438/600 |
| 5,538,917 A | 7/1996 | Kunitou | |
| 5,614,421 A | 3/1997 | Yang | |
| 5,728,622 A | 3/1998 | Yu | |
| 5,782,622 A | 7/1998 | Ozu et al. | |
| 5,911,109 A * | 6/1999 | Razouk et al. | 438/424 |
| 6,163,047 A * | 12/2000 | Sung et al. | 257/306 |
| 6,355,532 B1 | 3/2002 | Seliskar et al. | |
| 6,511,887 B1 * | 1/2003 | Yu et al. | 438/275 |
| 6,921,932 B1 * | 7/2005 | Yu et al. | 257/256 |
| 7,153,776 B2 * | 12/2006 | Chen et al. | 438/689 |

OTHER PUBLICATIONS

Gian Gerosa et al., "A High Perfomance CMOS Technology for 256K/1MB EPROMs", 1985 IEEE, pp. 631-634.

* cited by examiner

*Primary Examiner*—Thao X Le
*Assistant Examiner*—Tanika Warrior

(57) ABSTRACT

A system and method is disclosed that prevents the formation of a vertical bird's beak structure in the manufacture of a semiconductor device. A polysilicon filled trench is formed in a substrate of the semiconductor device. A composite layer stack is formed over the trench that has a nitride layer as a top layer. A plasma enhanced chemical vapor deposition (PECVD) oxide cap layer is formed over the nitride layer over the trench area. A mask and etch process is then applied to etch the composite layer stack adjacent to the polysilicon filled trench. A field oxide process is applied to form field oxide portions in the substrate adjacent to the trench. Because no field oxide is placed over the trench there is no formation of a vertical bird's beak structure. A gate oxide layer is applied to protect the trench from unwanted effects of subsequent processing steps.

20 Claims, 7 Drawing Sheets

SYSTEM AND METHOD FOR PROVIDING A NITRIDE CAP OVER A POLYSILICON FILLED TRENCH TO PREVENT FORMATION OF A VERTICAL BIRD'S BEAK STRUCTURE IN THE MANUFACTURE OF A SEMICONDUCTOR DEVICE

RELATED PATENT APPLICATION

The present invention is related to the invention disclosed and claimed in U.S. patent application Ser. No. 11/201,761 filed concurrently with the present patent application.

TECHNICAL FIELD OF THE INVENTION

The present invention relates generally to the manufacture of semiconductor devices and, more particularly, to a system and method for preventing the formation of a vertical bird's beak structure during a manufacturing process.

BACKGROUND OF THE INVENTION

Some types of semiconductor manufacturing processes utilize a polysilicon buffered LOCOS (Local Oxidation of Silicon) field oxidation process to provide device to device isolation in conjunction with a deep polysilicon filled trench. A standard prior art technique comprises growing field oxide over a polysilicon filled trench to isolate the trench polysilicon from further processing. This type of manufacturing process creates a vertical bird's beak structure on both sides of the trench where the liner oxide of the trench intersects with the surface.

It has been shown that the presence of a vertical bird's beak structure is a very significant contributor to creating additional stress in the silicon due to the expansion of the silicon dioxide in the confined trench liner region near the surface. The expansion of the liner oxide region causes compressive stress in the silicon surrounding the trench. This stress can be transmitted downwardly into the silicon bulk.

There have been prior art attempts to minimize the amount of stress that is produced by a vertical bird's beak structure. For example, a paper by Yang et al. entitled "Characterization of Collector-Emitter Leakage in Self-Aligned Double-Poly Bipolar Junction Transistors", 140 J. Electrochem. Soc. 3033-3037 (October 1993), suggests that the stress produced by the volume expansion from oxidation can be reduced by minimizing the size of the vertical bird's beak structure.

This can be achieved by reducing the deep trench surface oxide thickness (as long as adequate isolation can still be provided). To improve the quality of isolation oxide, a sacrificial layer can be grown and stripped off before the final layer is grown. The corner of the trench can be rounded off to reduce the stress that is generated due to volume misfit of the growing oxide.

The oxidation conditions, on the other hand, can be varied to relieve the oxide stress through the viscous elastic flow of the oxide. Variations in process conditions, such as the mixture of oxidation gas or oxidation temperature will affect the properties of the grown oxide as well as the generated defects.

The paper by Yang et al. also states that at higher oxidation temperature, the grown oxide has the ability to redistribute itself (due to lower viscosity) and thereby reduce the amount of stress on the neighboring silicon region.

This approach and others similar to it are directed at minimizing the stress that is due to the presence of the bird's beak structure. It would be advantageous to have a system and method that would prevent the formation of a bird's beak structure in the first place during the manufacture of a semiconductor device.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; "each" means every one of at least a subset of the identified items; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 16, discussed below, and the various embodiments used to describe the principles of the present invention in this patent document are by way of illustration only and should not be construed in any way to limit the scope of the invention. Those skilled in the art will understand that the principles of the present invention may be implemented for any type of suitably arranged semiconductor device.

Figure 1:
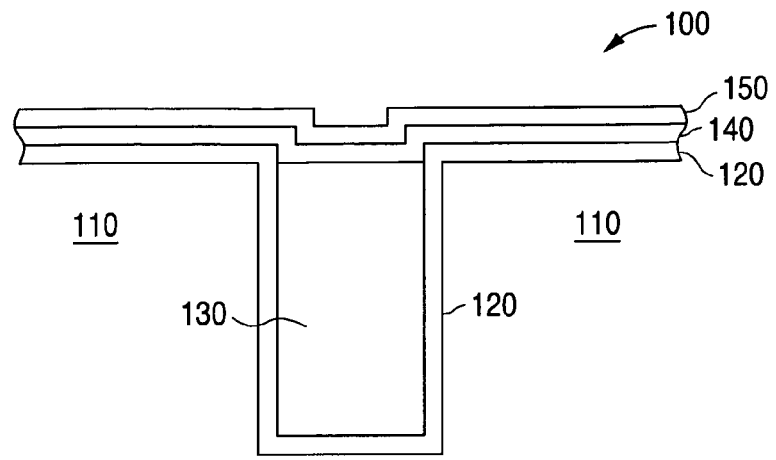
FIGS. 1 through 4 illustrate exemplary stages of manufacture of a prior art polysilicon filled trench that creates a vertical bird's beak structure.

FIG. 1 is a diagram 100 illustrating a cross sectional view of a polysilicon filled trench in a substrate of a semiconductor device. Using conventional methods an isolation trench is etched in substrate 110. Then a liner oxide layer 120 is formed on the walls of the trench. The trench is then filled with polysilicon 130. Additional layers of material, polysilicon 140 and silicon nitride 150, are then applied over the oxide layer 120 to cover the polysilicon filled trench. The layers 120, 140 and 150 may be collectively referred to as composite layers.

Figure 2:
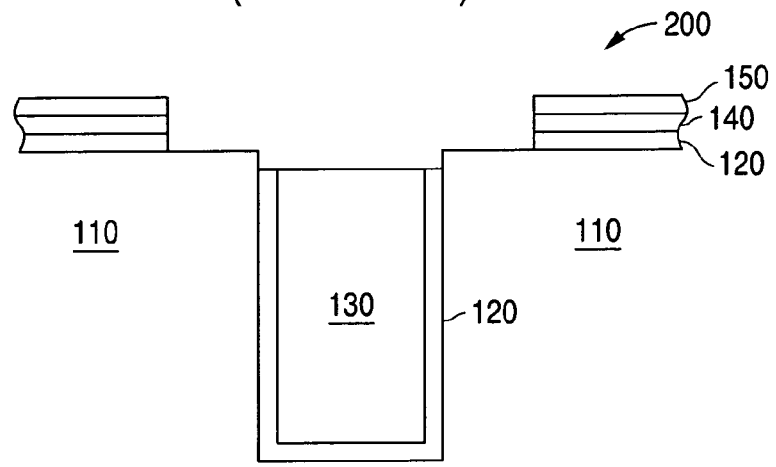

FIG. 2 illustrates the result of applying a mask and etch process to etch the composite layers 120, 140 and 150 over the polysilicon filled trench. The resulting structure 200 is then subjected to a field oxide process to grow a field oxide 310 over the polysilicon filled trench. The presence of the field oxide 310 over the polysilicon filled trench is to isolate the polysilicon 130 in the trench from further processing. This prior art method creates a vertical bird's beak structure where the liner oxide 120 intersects with the field oxide 310 at the top of the trench. The vertical bird's beak structure contributes to additional stress in the silicon due to the expansion of the material of liner oxide 120 near the top of the trench. The additional stress may form dislocation points and defects that will lead to junction leakage.

Figure 3:
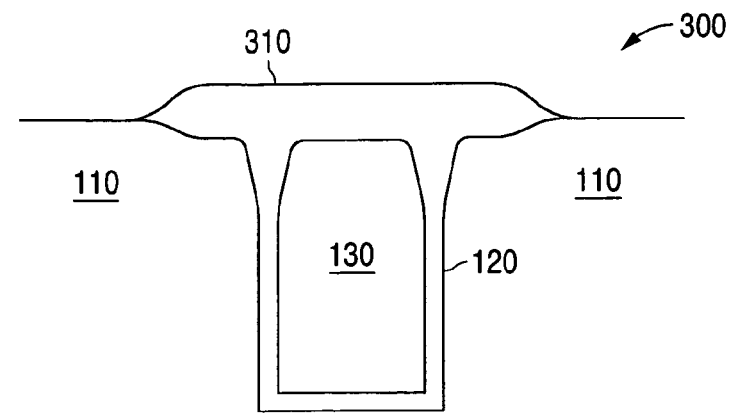
Figure 4:
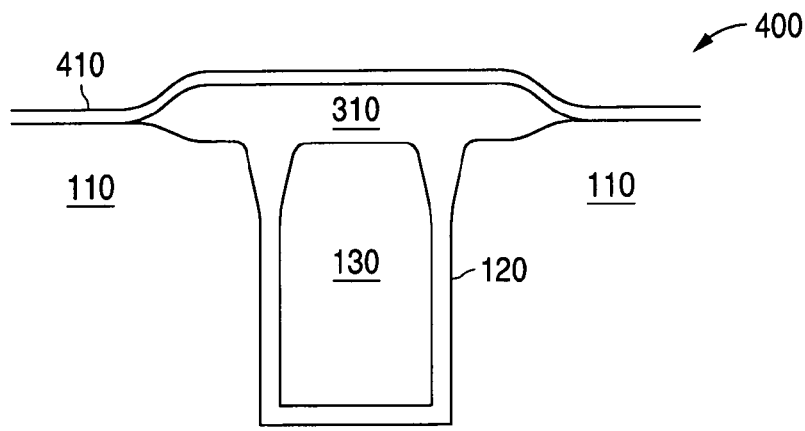

After the field oxide 310 has been formed, the composite layers 120, 140 and 150 on the substrate 110 are stripped away using conventional methods. FIG. 3 illustrates the resulting structure 300. Then a gate oxide process is applied to cover the structure 300 with a gate oxide layer 410. The resulting structure is designated with reference numeral 400.

Figure 5:
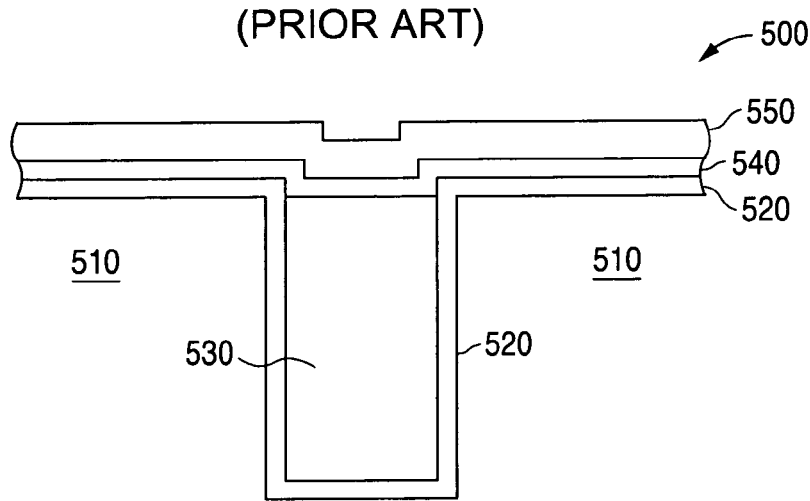
FIGS. 5 through 14 illustrate exemplary stages of construction of a polysilicon filled trench of the present invention that does not create a vertical bird's beak structure.

In contrast to the prior art method, the method of the present invention does not create a vertical bird's beak structure. FIG. 5 illustrates the same structure as FIG. 1. FIG. 5 is a diagram 500 illustrating a cross sectional view of a polysilicon filled trench in a substrate of a semiconductor device. Using conventional methods an isolation trench is etched in substrate 510. Then a liner oxide layer 520 is formed on the walls of the trench. The trench is then filled with polysilicon 530. Additional layers of material, polysilicon 540 and silicon nitride 550, are then applied over the oxide layer 520 to cover the polysilicon filled trench. The layers 520, 540 and 550 may be collectively referred to as composite layers.

Figure 6:
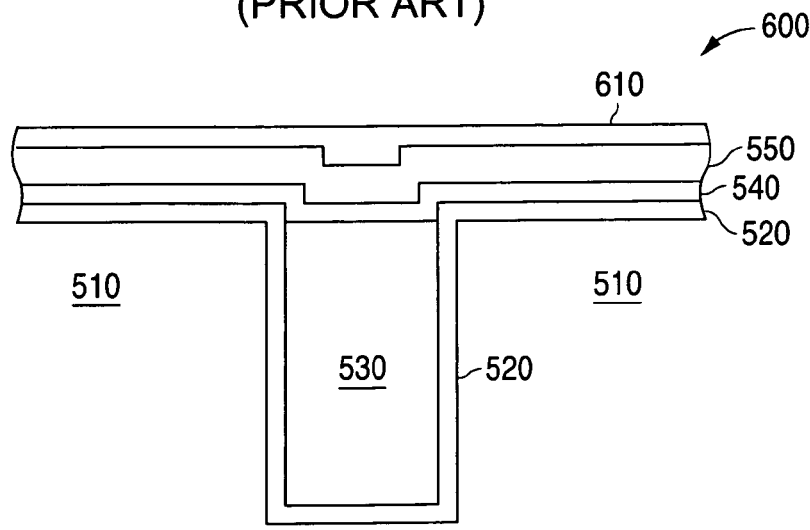

FIG. 6 illustrates the result of applying a thin plasma enhanced chemical vapor deposition (PECVD) oxide layer 610 over the silicon nitride layer 550. In one advantageous embodiment the thickness of the silicon nitride layer 550 is approximately one thousand eight hundred Angstroms (1800 Å). In one advantageous embodiment of the invention the thickness of the PECVD oxide layer 610 is approximately five hundred Angstroms (500 Å). For clarity of illustration the drawings showing the various structures are not drawn to scale.

Figure 7:
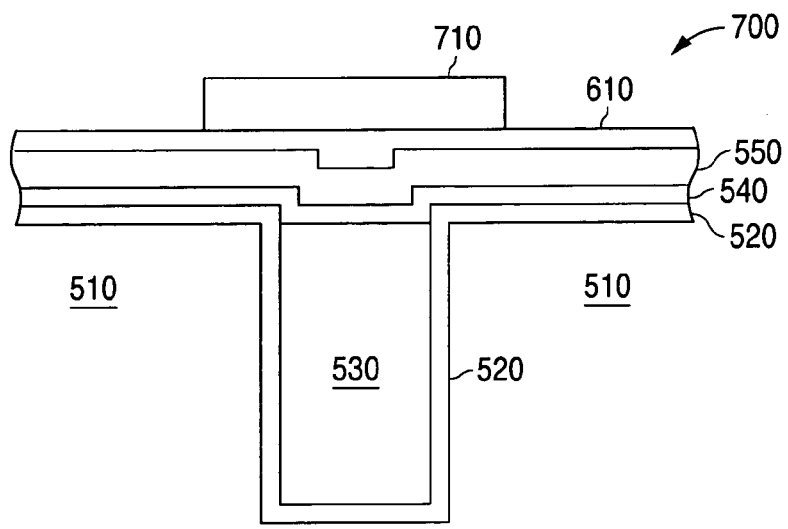

Then a trench protect mask 710 is formed over the trench area. FIG. 7 illustrates the result of forming a trench protect mask 710 over the PECVD oxide layer 610 over the trench area. In one advantageous embodiment of the invention the lateral dimensions of the trench protect mask 710 extend one micron ($10^{-6}$ m) on each side of the trench.

Figure 8:
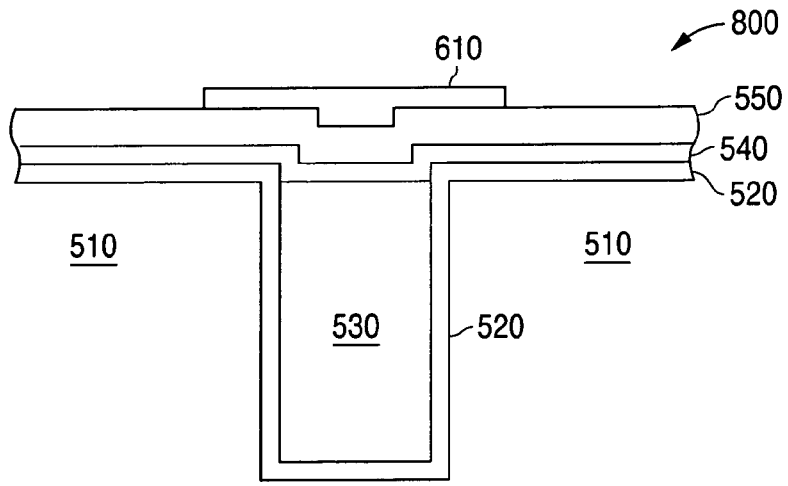

Then a wet etch process is applied to etch away the portions of the thin PECVD oxide layer 610 that are not located under the trench protect mask 710. FIG. 8 illustrates the resulting structure 800 after the wet etch process has been completed and the trench protect mask 710 has been stripped away. The remaining portion of the thin PECVD oxide layer 610 forms a protective cap of PECVD oxide over the silicon nitride layer 550.

Figure 9:
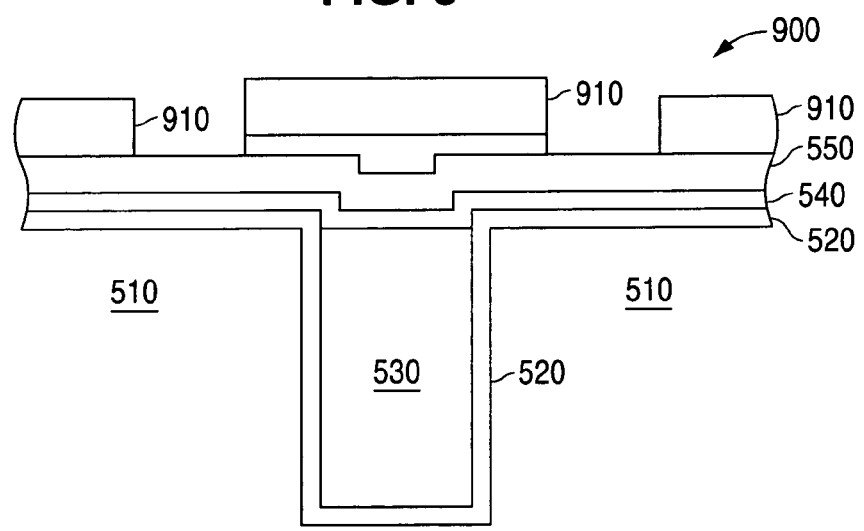

As shown in FIG. 9, a composite mask 910 is then formed over the PECVD oxide cap layer 610 and over the silicon nitride layer 550. The resulting structure is designated with reference numeral 900. The composite mask 910 is patterned to create apertures that are adjacent to the trench area. An etch process is then applied to etch the composite layers.

Figure 10:
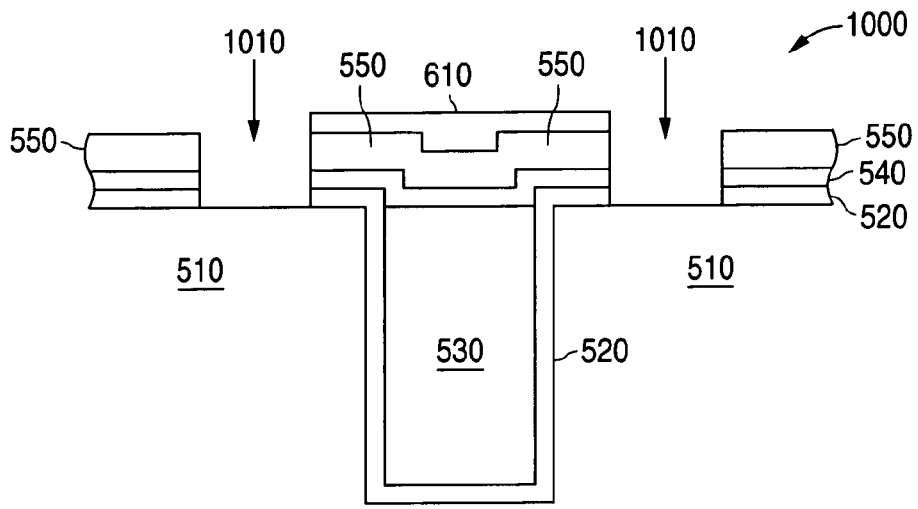

FIG. 10 illustrates the structure 1000 that results after the etch process has been applied to etch the composite layers 520, 540 and 550. As shown in FIG. 10, the composite layers 520, 540 and 550 are not etched over the polysilicon filled trench as in the prior art method. Instead the composite layers 520, 540 and 550 are etched at locations 1010 that are adjacent to the polysilicon filled trench. The portions of the composite layers 520, 540 and 550 that are located over the polysilicon filled trench remain in place. This means that there will be no field oxide formed over the polysilicon filled trench. This will prevent the creation of a bird's beak structure and its attendant problems.

Figure 11:
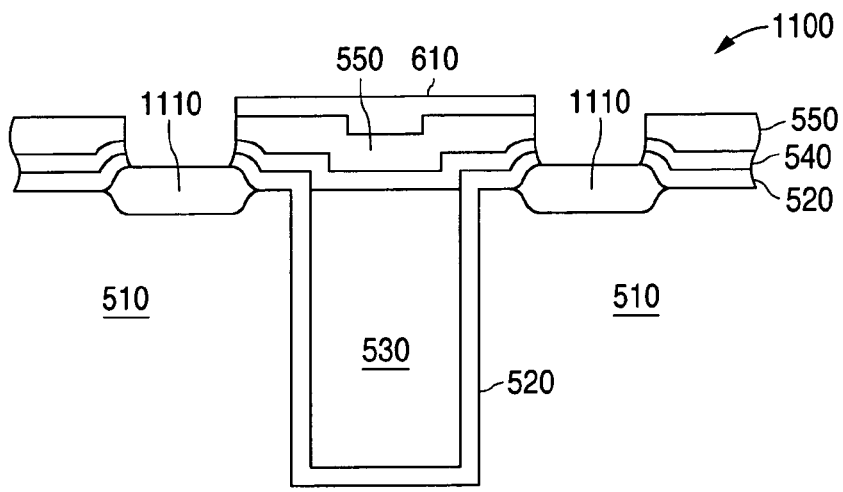

The structure 1000 in FIG. 10 is then subjected to a field oxide process to grow a field oxide 1110 in the locations that are adjacent to the polysilicon filled trench. FIG. 11 illustrates the resulting structure 1100 after the field oxide 1110 has been formed.

Figure 12:
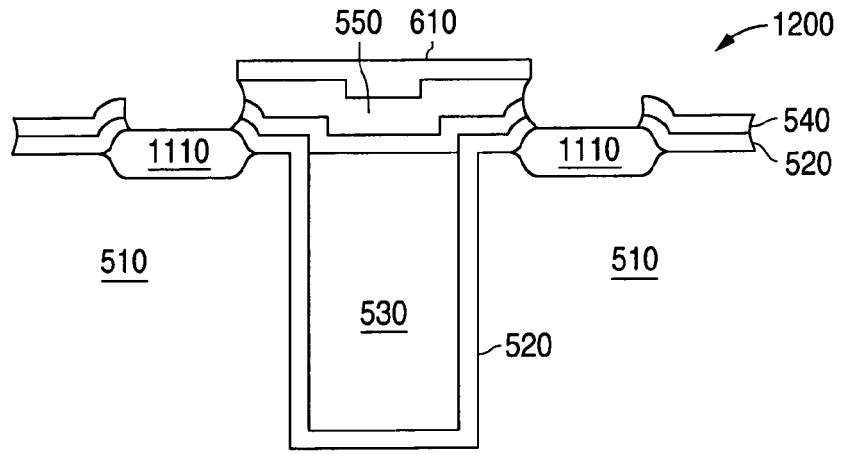

Then a hot phosphoric chemical process is applied to strip away portions of the nitride layer 550 that are not located under the PECVD oxide cap layer 610. The presence of the PECVD oxide cap layer 610 prevents the removal of the portions of the nitride layer 550 that are under the PECVD oxide cap layer 610. FIG. 12 illustrates the resulting structure 1200 after the hot phosphoric chemical process has been applied to strip away portions of the nitride layer 550. The thickness of the PECVD oxide cap layer 610 is reduced somewhat by the application of the hot phosphoric chemical process. In one advantageous embodiment the thickness of the PECVD oxide cap layer 610 is reduced from approximately five hundred Angstroms (500 Å) to approximately three hundred fifty Angstroms (350 Å).

Figure 13:
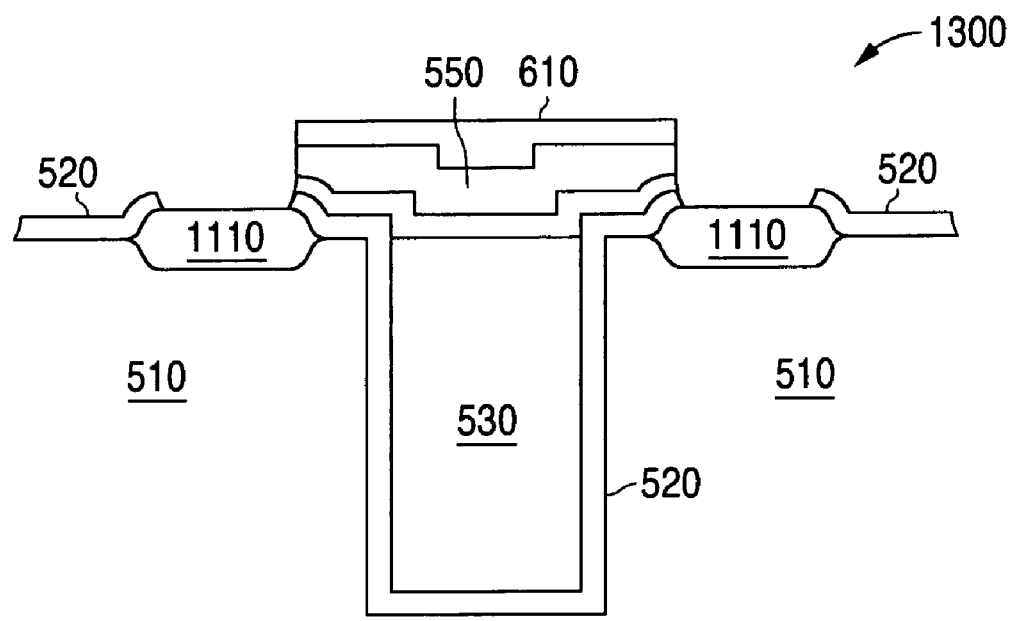

Then a plasma poly strip process is apply to strip away portions of the poly layer 540 that are not located under the PECVD oxide cap layer 610. The presence of the PECVD oxide cap layer 610 and the nitride layer 550 prevent the removal of the portions of the poly layer 540 that are under the PECVD oxide cap layer 610. FIG. 13 illustrates the resulting structure 1300 after the plasma poly strip process has been applied to strip away portions of the poly layer 540. The thickness of the PECVD oxide cap layer is further reduced somewhat by the application of the plasma poly strip process. In one advantageous embodiment the thickness of the PECVD oxide cap layer 610 is reduced from approximately three hundred fifty Angstroms (350 Å) to approximately three hundred twenty Angstroms (320 Å).

Figure 14:
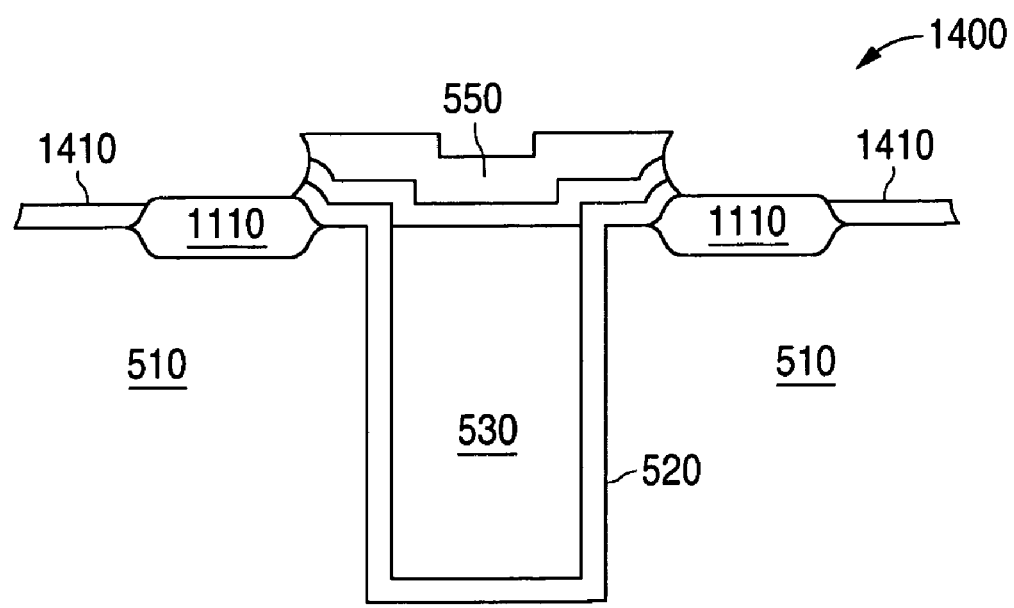

The line oxide layer 520 on the surface is then stripped away. The process that strips away the liner oxide layer 520 also strips away the PECVD oxide cap layer 610. Lastly, a gate oxide process is applied to grow a gate oxide layer 1410 on the surface of the substrate 510. As shown in FIG. 14, the resulting structure is designated with reference numeral 1400.

In the present invention a vertical bird's beak structure is not formed near the polysilicon filled trench. This means that the polysilicon filled trench of the present invention does not experience the additional stress that is associated with the presence of a vertical bird's beak structure. In addition, the presence of the nitride layer 550 and the PECVD oxide cap layer 610 ensure that the polysilicon filled trench will not be susceptible to downstream process effects (e.g., silicide effects) that may lead to the formation of a conductive path across the trench liner oxide 520 to adjacent active circuitry.

Figure 15:
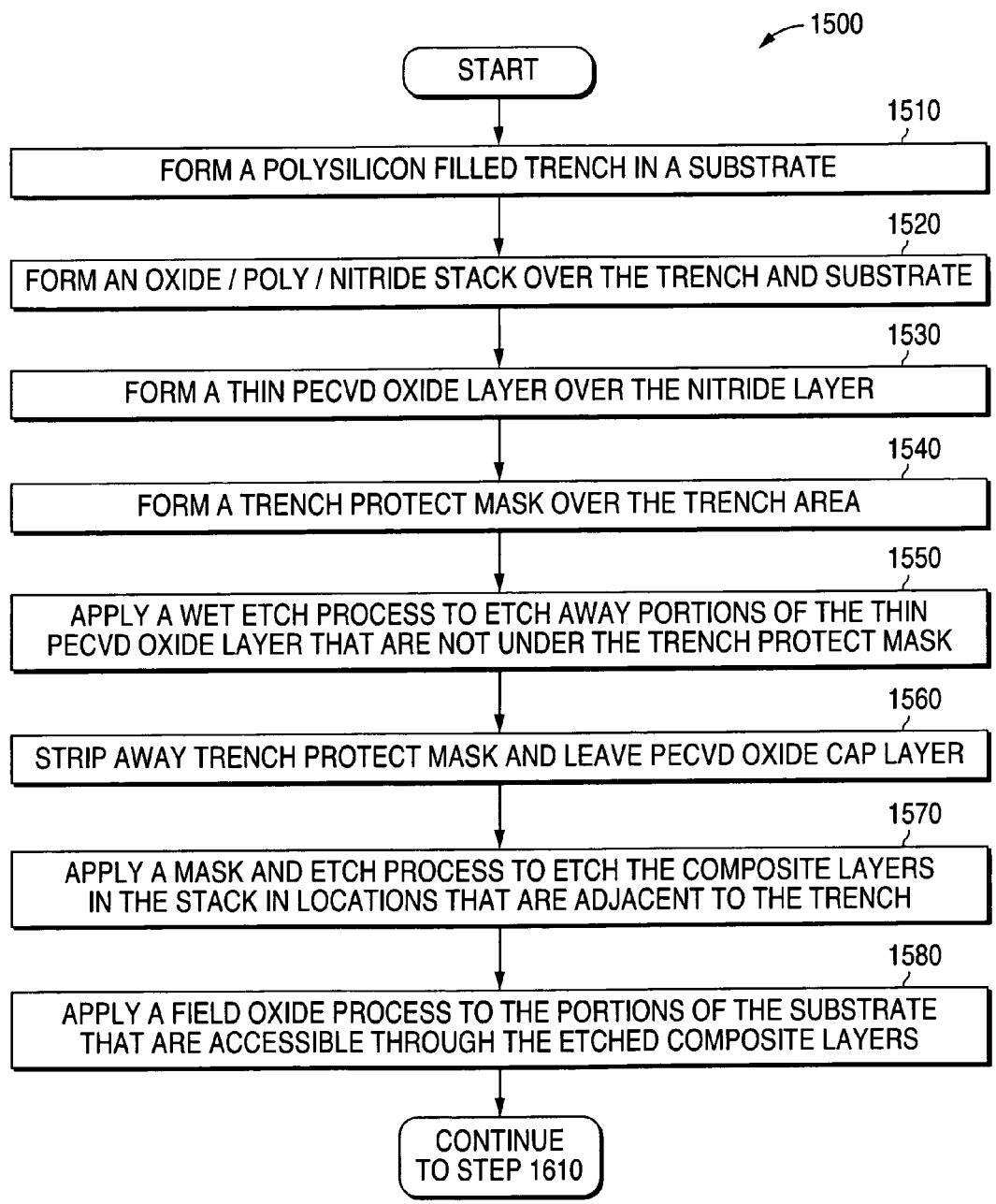
FIGS. 15 and 16 illustrate a flow chart showing the steps of an advantageous embodiment of a method of the present invention.

FIG. 15 illustrates a flow chart showing a first portion of steps 1500 of an advantageous embodiment of a method of the present invention. In the first step of the method a polysilicon filled trench is formed in a substrate of a semiconductor device (step 1510). Then an oxide/poly/nitride stack is formed over the trench and substrate (step 1520).

A thin PECVD oxide layer is then formed over the nitride layer (step 1530). Then a trench protect mask is formed over the thin PECVD oxide layer over the trench area (step 1540). Then a wet etch process is applied to etch away portions of the thin PECVD oxide layer that are not under the trench protect mask (step 1550). Then the trench protect mask is stripped away leaving a thin PECVD oxide cap layer over the trench area (step 1560).

A mask and etch process is then applied to etch the composite layers in locations that are adjacent to the trench (step 1570). Then a field oxide process is applied to the portions of the substrate that are accessible through the etched composite layers (step 1580). Then control of the process passes to step 1610 of FIG. 16.

Figure 16:
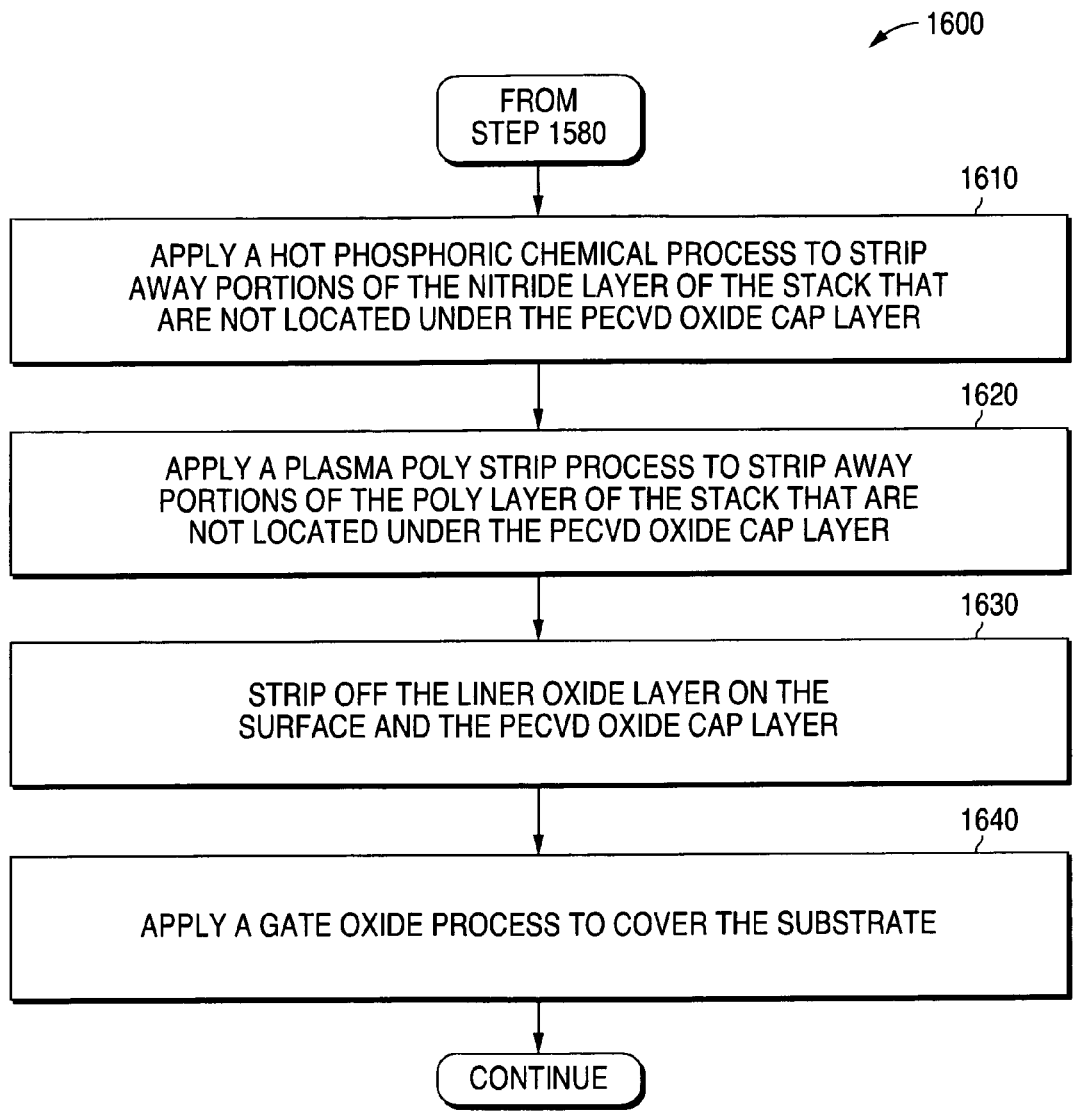

FIG. 16 illustrates a flow chart showing a second portion of steps 1600 of an advantageous embodiment of a method of the present invention. Control passes to step 1610 from step 1580 of FIG. 15. A hot phosphoric chemical process is applied to strip away portions of the nitride layer of the stack that are not located under the PECVD oxide cap layer (step 1610).

Then a plasma poly strip process is applied to strip away portions of the poly layer of the stack that are not located under the PECVD oxide cap layer (step 1620). Then, the liner oxide layer on the surface and the PECVD oxide cap layer are stripped away (step 1630). Lastly, a gate oxide process is applied to cover the substrate (step 1640).

The system and method of the present invention provides several benefits. The first benefit is the elimination of the vertical bird's beak structure near the polysilicon filled trench. The second benefit is the elimination of the increased levels of stress in the silicon. The third benefit is the reduction of the trench to comp space. The fourth benefit is the elimination of trench to sinker (high dopant level) sensitivity.

Although the present invention has been described with several embodiments, various changes and modifications may be suggested to one skilled in the art. It is intended that the present invention encompass such changes and modifications as fall within the scope of the appended claims.

What is claimed is:

1. A method for manufacturing a semiconductor device, said method comprising the steps of:
    providing a semiconductor device substrate;
    forming a polysilicon filled trench in said substrate;
    not oxidizing polysilicon in the polysilicon filled trench;
    forming over said polysilicon filled trench and said substrate a composite layer stack that comprises a layer of nitride as a top layer;
    applying a mask and etch process to form a plasma enhanced chemical vapor deposition (PECVD) oxide cap layer over said nitride layer and over said polysilicon filled trench;
    applying a mask and etch process to etch said composite layer stack in at least one location that is adjacent to said polysilicon filled trench;
    applying a field oxide process to portions of said substrate that are accessible through said etched portions of said composite layer stack;
    removing unetched portions of said composite layer stack that are not located under said PECVD oxide cap layer; and
    forming a gate oxide layer over said substrate and said field oxide portions and said PECVD oxide cap layer.

2. The method as set forth in claim 1 further comprising the step of:
    preventing a creation of a vertical bird's beak structure near said polysilicon filled trench by not placing field oxide over said polysilicon filled trench.

3. The method as set forth in claim 1 further comprising the step of:
    preventing an increase in stress experienced by said polysilicon filled trench and experienced by said substrate by not placing field oxide over said polysilicon filled trench.

4. The method as set forth in claim 1 further comprising the step of:
    forming said PECVD oxide cap layer to extend laterally over said polysilicon filled trench by approximately one micron on each side of said polysilicon filled trench.

5. The method as set forth in claim 1 further comprising the step of:
    protecting said polysilicon filled trench by covering said polysilicon filled trench by said nitride layer and said PECVD oxide cap layer.

6. The method as set forth in claim 1 further comprising the step of:
    protecting said polysilicon filled trench against unwanted effects of a subsequent processing step by covering said polysilicon filled trench by said nitride layer and said PECVD oxide cap layer.

7. The method as set forth in claim 6 wherein said subsequent processing step comprises silicidation.

8. The method as set forth in claim 7 wherein said unwanted effect of said silicidation processing step comprises silicidation of the polysilicon within said polysilicon filled trench.

9. A method for preventing formation of a vertical bird's beak structure in a semiconductor device, said method comprising the steps of:
    providing a semiconductor device substrate;
    forming a polysilicon filled trench in said substrate;
    not oxidizing polysilicon in the polysilicon filled trench;
    forming over said polysilicon filled trench and said substrate a composite layer stack that comprises a layer of nitride as a top layer;
    applying a mask and etch process to form a plasma enhanced chemical vapor deposition (PECVD) oxide cap layer over said nitride layer and over said polysilicon filled trench;
    applying a mask and etch process to etch said composite layer stack in at least one location that is adjacent to said polysilicon filled trench;
    applying a field oxide process to portions of said substrate that are accessible through said etched portions of said composite layer stack;
    not placing field oxide over said polysilicon filled trench;
    removing unetched portions of said composite layer stack that are not located under said PECVD oxide cap layer; and
    forming a gate oxide layer over said substrate and said field oxide portions and said PECVD oxide cap layer.

10. The method as set forth in claim 9 further comprising the step of:
    preventing an increase in stress experienced by said polysilicon filled trench and experienced by said substrate by not placing field oxide over said polysilicon filled trench.

11. The method as set forth in claim 9 further comprising the step of:
    protecting said polysilicon filled trench against unwanted effects of a subsequent processing step by covering said polysilicon filled trench by said nitride layer and said PECVD oxide cap layer.

12. A method for manufacturing a semiconductor device, said method comprising the steps of:
    providing a semiconductor device substrate;
    forming a polysilicon filled trench in said substrate;
    not oxidizing polysilicon in the polysilicon filled trench;
    forming over said polysilicon filled trench and said substrate a composite layer stack that comprises a layer of nitride as a top layer;

applying a mask and etch process to form a plasma enhanced chemical vapor deposition (PECVD) oxide cap layer over said nitride layer and over said polysilicon filled trench;

applying a mask and etch process to etch said composite layer stack down to the semiconductor device substrate in at least one location that is adjacent to said polysilicon filled trench;

applying a field oxide process to portions of said substrate that are accessible through said etched portions of said composite layer stack;

removing unetched portions of said composite layer stack that are not located under said PECVD oxide cap layer; and forming a gate oxide layer over said substrate and said field oxide portions and said PECVD oxide cap layer.

13. The method as set forth in claim 12 further comprising the step of:

preventing a creation of a vertical bird's beak structure near said polysilicon filled trench by not placing field oxide over said polysilicon filled trench.

14. The method as set forth in claim 12 further comprising the step of:

preventing an increase in stress experienced by said polysilicon filled trench and experienced by said substrate by not placing field oxide over said polysilicon filled trench.

15. The method as set forth in claim 12 further comprising the step of:

forming said PECVD oxide cap layer to extend laterally over said polysilicon filled trench by approximately one micron on each side of said polysilicon filled trench.

16. The method as set forth in claim 12 further comprising the step of:

protecting said polysilicon filled trench by covering said polysilicon filled trench by said nitride layer and said PECVD oxide cap layer.

17. The method as set forth in claim 12 further comprising the step of:

protecting said polysilicon filled trench against unwanted effects of a subsequent processing step by covering said polysilicon filled trench by said nitride layer and said oxide cap layer.

18. The method as set forth in claim 17 wherein said subsequent processing step comprises silicidation.

19. The method as set forth in claim 9 further comprising the step of:

protecting said polysilicon filled trench by covering said polysilicon filled trench by said nitride layer and said PECVD oxide cap layer.

20. The method as set forth in claim 11 wherein said subsequent processing step comprises silicidation.

* * * * *